United States Patent
Seppä et al.

(10) Patent No.: US 7,548,074 B2
(45) Date of Patent: Jun. 16, 2009

(54) MICROMECHANICAL MICROWAVE POWER METER

(76) Inventors: Heikki Seppä, Partiotie 26, FI-00370 Helsinki (FI); Jukka Kyynäräinen, Löylytie 7 A, FI-02270 Espoo (FI)

( * ) Notice: Subject to any disclaimer, the term of this patent is extended or adjusted under 35 U.S.C. 154(b) by 9 days.

(21) Appl. No.: 11/630,575

(22) PCT Filed: Jun. 16, 2005

(86) PCT No.: PCT/FI2005/000286

§ 371 (c)(1),
(2), (4) Date: Jan. 19, 2007

(87) PCT Pub. No.: WO2006/000622

PCT Pub. Date: Jan. 5, 2006

(65) Prior Publication Data

US 2008/0068031 A1 Mar. 20, 2008

(30) Foreign Application Priority Data

Jun. 29, 2004 (FI) .................................. 20040903

(51) Int. Cl.
*G01R 27/26* (2006.01)
*G01R 25/02* (2006.01)
(52) U.S. Cl. ........................ 324/661; 324/658; 324/95
(58) Field of Classification Search ................ 324/661, 324/658, 649, 600, 635, 644, 662, 699, 716, 324/519, 686
See application file for complete search history.

(56) References Cited

U.S. PATENT DOCUMENTS

| | | | |
|---|---|---|---|
| 4,932,617 A * | 6/1990 | Heddebaut et al. ............. | 246/8 |
| 5,204,613 A | 4/1993 | Cripps et al. | |
| 5,543,689 A * | 8/1996 | Ohta et al. ............. | 315/111.21 |
| 6,242,901 B1 * | 6/2001 | Faick et al. .................... | 324/95 |
| 7,330,271 B2 * | 2/2008 | Frick .......................... | 356/480 |
| 2004/0056668 A1 | 3/2004 | Park | |

FOREIGN PATENT DOCUMENTS

EP  0 320 265 A2  6/1989
EP  1 355 162 A1  10/2003

OTHER PUBLICATIONS

Seppa et al., IEEE Transactions on Instrumentation and Measurement, vol. 50, No. 2, Apr. 2001, pp. 440-444.

* cited by examiner

*Primary Examiner*—Timothy J Dole
*Assistant Examiner*—Hoai-An D Nguyen
(74) *Attorney, Agent, or Firm*—McDonnell Boehnen Hulbert & Berghoff LLP

(57) ABSTRACT

A micromechanical sensor for measuring millimetric wave or microwave power, which sensor includes a wave line for conducting the millimetric or microwave power and a moving part and a fixed electrode, in such a way that the capacitance (C) between the moving part and the fixed electrode couples to the wave power advancing in the wave line. According to the invention, the capacitance (C) between the moving part and the fixed electrode is divided into at least two portions (C/n), which are located at a distance from each other, in such a way that the wave power advancing in the wave line couples to the portions (C/n) of the capacitance (C) consecutively and experiences the inductive load between the portions (C/n) of the capacitance (C). Thus the frequency band of the sensor can be substantially broadened and the reflective coefficient can be kept reasonably small.

20 Claims, 2 Drawing Sheets

MICROMECHANICAL MICROWAVE POWER METER

The present invention relates to a micromechanical sensor, according to the preamble of claim 1, for measuring millimetric wave or microwave power.

Components of this kind typically comprise a wave line for conducting millimetric wave or microwave power and a part that is arranged to move and a fixed electrode, in such a way that the capacitance between the part that is arranged to move and the fixed electrode couples to the wave power advancing in the wave line. In this case, the capacitance coupling to the millimetric wave power or microwave power advancing in the wave line refers to the fact that the voltage associated with the wave power causes a power in the capacitance. The force caused tends to cause deviation in the moving part of the component.

Microwave power measuring sensors of this type have the advantage that the sensor consumes practically no power. This is based on the fact that the measuring principle as such is not based on the consumption of power; instead the intention is to lead the power through the sensor. Of course, the measuring sensor absorbs a small amount of microwave power, but the power consumption mainly arises from the fact that the sensor reflects part of the microwave power back in the microwave line. The reflective coefficient of the sensor thus substantially affects the power consumption of the sensor. Due to the reflective coefficient, the frequency band that is suitable for the sensor remains relatively small.

Patent application publication US 2004/0056668 A1 discloses one known solution for the measurement of radio-frequency power. A similar solution is also disclosed in the publication Heikki Seppä, Jukka Kyynäräinen, and Aarne Oja, 'Micromechanical Systems in Electrical Metrology', IEEE Transactions on Instrumentation and Measurement, Vol. 50, No. 2, April 2001.

The invention is intended to improve the properties of a sensor, in such a way that the reflective coefficient will remain relatively small over a broader frequency band.

The invention is based on the capacitance between the part of the sensor that is arranged to move and the fixed electrode being divided into at least two parts, which are located at a distance from each other, in such a way that the millimetric wave or microwave power advancing in the wave line couples consecutively to the portions of the capacitance and experiences an inductive load between the portions.

More specifically, the sensor according to the invention is characterized by what is stated in the characterizing portion of claim 1.

Considerable advantages are gained with the aid of the invention. This is because, with the aid of the invention, it is possible to substantially broaden the frequency band of the sensor, over which the reflective coefficient will remain reasonably small.

Thus the invention permits several advantageous embodiments. For example, the sensor can also be used in the millimetric wave range. The sensor has many applications, for example, in mobile telephones and other devices, in which sensors that are sensitive to millimetric wave or microwave power are required.

The sensor according to the invention differs essentially from the sensors disclosed in the aforementioned publications US 2004/0056668 and 'Micromechanical Systems in Electrical Metrology' precisely in that, according to the invention, the capacitance, to which the wave power advancing over the wave line couples as it travels over the wave line, comprises portions. In addition, these divided portions are located at a distance from each other, in such a way that the wave power advancing in the wave line couples to the portions of the capacitance consecutively and experiences an inductive load between the portions.

In the known solutions, the capacitance C between the part that is arranged to move and the fixed electrode consists of a single part. The force coupled to this single part moves the part that is arranged to move, which in turn affect the separate capacitance used in the measurement.

In other words, in one embodiment of our invention, the path of progression of the wave power is as follows: 1) the wave line preceding the sensor, 2) the first portion of the capacitance, 3) the inductive load, 4) the second portion of the capacitance, and 5) the wave line after the sensor. In a second embodiment, there are additionally one or more capacitance portions between the second portion of the capacitance and the wave line after the sensor, as well as inductive loads between them. In the known solutions depicted in the reference publications, on the other hand, the progression of the wave power is as follows: 1) wave line preceding the sensor, 2) capacitance, and 3) wave line after the sensor.

In the following, the invention is examined with the aid of examples and with reference to the accompanying drawings. The examples shown are intended to illustrate the properties of embodiments of the invention and to examine the theoretical background to the invention. The examples do not restrict the scope of protection, which is defined in the claims.

Figure 1:
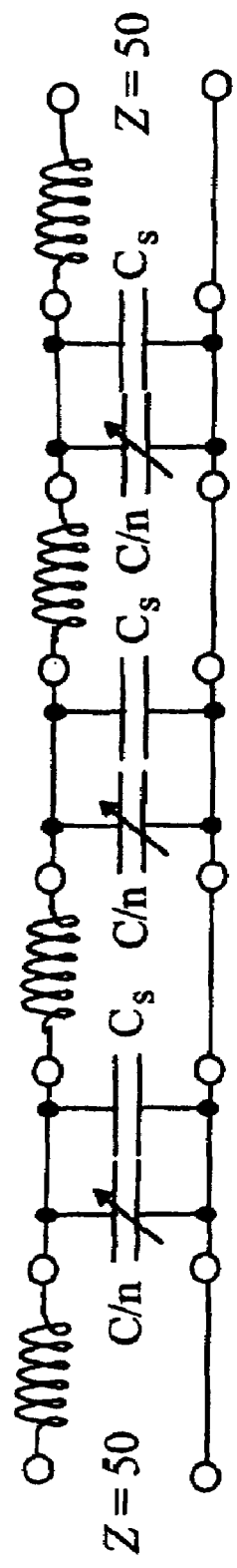
FIG. 1 shows an arrangement of an electrical equivalent circuit according to one embodiment.

It is well known that the voltage arising over a micromechanical component causes a force proportional to the effective value of the voltage. By measuring the movement caused by the force, we can determine, for example, the magnitude of the effective value of a microwave-frequency voltage. The force between two conductive places can be written in the form $$F = \frac{C_0}{2(d-x)^2} U^2$$

in which $C_0$ is the capacitance of the component when in a state of rest, d is the distance between the metal plates without external forces, and x is the movement created by the force caused by the voltage.

If the power being measured travels in a wave line with a known wave impedance, we can determine the high-frequency power advancing in the wave line on the basis of the effective value of the voltage. Because the element being measured creates a capacitance in the line, it causes reflections of the microwave power. The reflections of the power lead to the accurate measurement range of the measurement sensor remaining very narrow. In practice, this means that the sensor can only be used in a frequency band, which is clearly smaller than the band of the RC circuit formed by the transmission line's impedance and capacitance. The theoretical frequency band obeys the equation $$\Delta B = \frac{1}{\pi CZ}$$

in which Z is the wave impedance of the transmission line and C is the capacitance created by the micromechanical power sensor. It should be noted that in this case we are assuming that the measurement sensor is connected to both a matched power supply and to a power-matched load. In principle, we could reduce the capacitance required for the measurement, but the resolution of the device (the smallest detectable change in the effective value of the voltage) depends decisively on the magnitude of the capacitance. The greater the surface area and the narrower the gap, the higher the resolution that is achieved. This can be seen from the equation in such a way that we can maximize the force arising from the voltage.

This invention presents a simple method for achieving a relatively small reflective coefficient and through it high measurement accuracy over the entire theoretical maximum band. Let us assume that the capacitance value required for an adequate resolution is C. Let us also assume that we divide this capacitance into two parts. The capacitances are set in such a way that the wavelength of the microwave is longer than the distance between the capacitors. In addition to this, we place coils between the capacitances. These are dimensioned in such a way that we minimize the reflective coefficient over the entire band $\Delta\beta$. In practice, the optimization is worth doing over a slightly smaller band than that permitted by the theoretical maximum. The arrangement leads to a sensor, in which the error leading to the reflections is minimized, but the resolution is not weakened. Another advantageous aspect is that the force arising over all the capacitors moves a single micromechanical structure. This means than we need to measure the movement or force arising over only a single moving component.

FIG. 1 shows a schematic diagram of a power meter, in which the measuring electrode is divided into three parts. The capacitances are electrically separate, but mechanically attached to each other. The division of the capacitances into several parts will improve the situation, but in practice at some stage the losses in the component will become too great. On the other hand, it is easy to show that it is not worth dividing a capacitor to be smaller than the stray capacitance $C_S$. In practice, the optimal n is in the order to 3-6. The basic rule is that the larger the frequency band desired, the smaller the total capacitance that must be selected and the smaller n. For example, in a power sensor, which covers the frequency range 0-40 GHz, a capacitance that is divided into three parts will, in our experience, lead to a good end result.

The end result of the method described above is a sharp-edged band-pass filter. In this case, we achieve a good measurement resolution over the entire frequency band being measured. In this preferred embodiment, the capacitance elements are attached to each other mechanically and move together from the effect of the microwave power.

Figure 2:
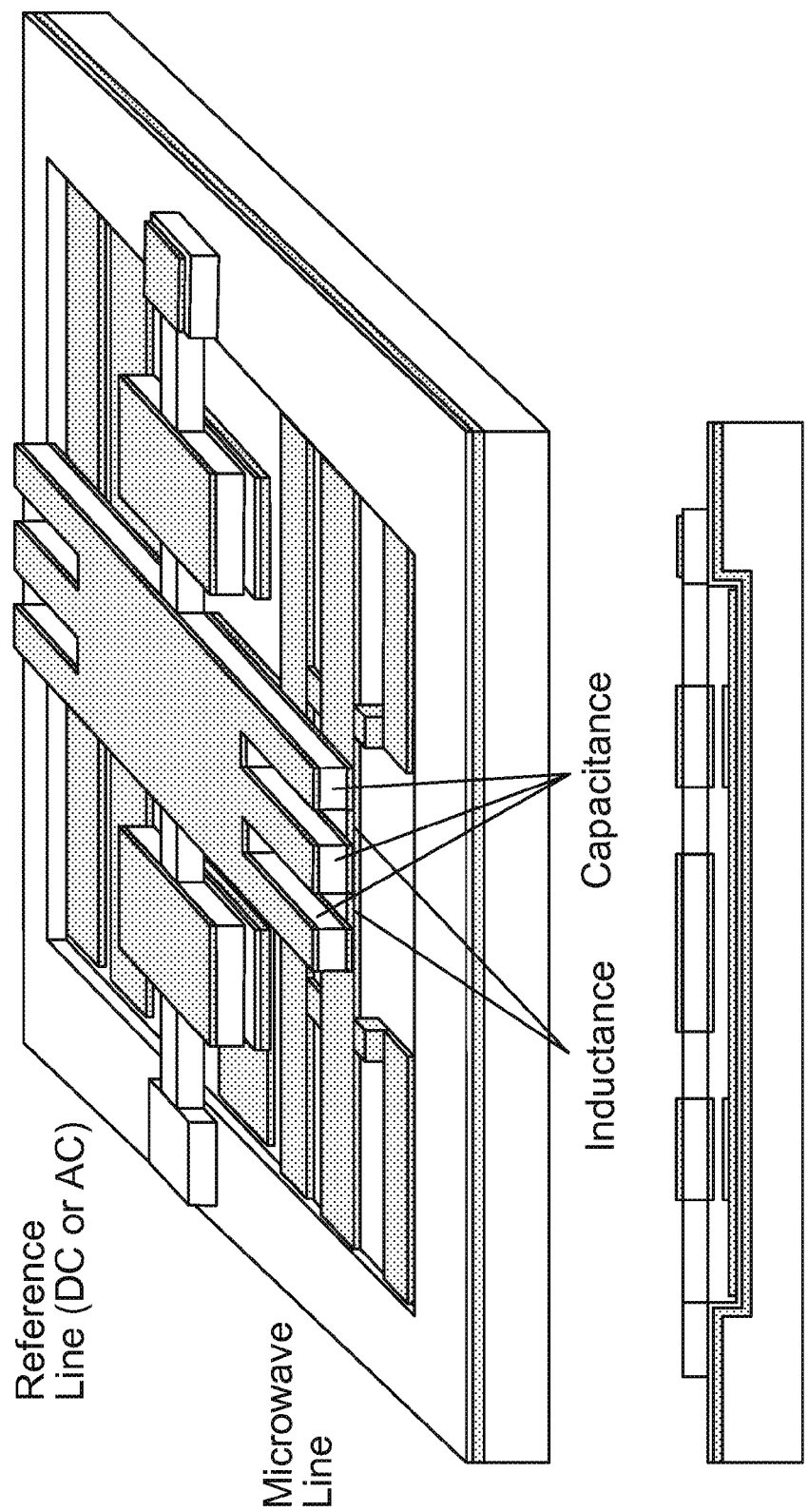
FIG. 2 shows an arrangement according to a second embodiment.

FIG. 2 shows one construction of the power sensor. In the figure, attention should be paid to the fact that, in addition to the divided capacitance, the ground line of the transmission line grounds the moving structure. This is important, because if we set the microwave voltage between the moving and fixed electrodes, the microwave-frequency current would have to travel to the moving part through the spring that supports it. Because the spring is thin and is preferably not metallized in order to avoid stresses, a large power loss would arise in the spring. If, on the other hand, the moving part is in the ground potential of the microwave line, we can use the arrangement to eliminate the microwave power being able to leak to elsewhere in the component. All these arrangements improve the measurement accuracy of the component.

The micromechanical sensor according to the embodiment, for measuring millimetric wave and microwave power, thus includes a wave line for conducting the millimetric wave or microwave power, the part that is arranged to move, and the fixed electrode, in such a way that the capacitance C between the part that is arranged to move and the fixed electrode couples to the wave power advancing in the wave line. The capacitance C between the part that is arranged to move and the fixed electrode is divided into at least two parts C/n, which are located at a distance from each other, in such a way that the wave power advancing in the wave line couples to the portions C/n of the capacitance C consecutively and experiences an inductive load between the portions C/n of the capacitance C.

In one embodiment, the distance between each portion C/n of the capacitance C is smaller than the wavelength of the millimetric wave or microwave power advancing in the wave line.

According to one embodiment, the distances between the consecutive portions C/n of the capacitance C are essentially equally large.

According to one embodiment, the capacitances of the portions C/n are mutually essentially equally large.

The above embodiments can be combined in such a way that the distance between the portions C/n of the capacitance C is smaller that the wavelength of the millimetric wave or microwave power advancing in the wave line, the distances between the portions C/n are essentially equally large, and the capacitances of the portions C/n are mutually essentially equally large.

In one embodiment, the sensor is designed in such a way that the forces, which arise when the millimetric wave or microwave power couples to the portions C/n of the capacitance C all move one and the same part arranged to move.

In one embodiment, the portions C/n of the capacitance C are electrically separate but are connected mechanically to each other.

In one embodiment, the wave line includes a ground line, which grounds the part arranged to move.

In one embodiment, the wave line includes a ground line, which grounds the portions C/n of the capacitance C.

In one embodiment, the magnitude of the inductive load between the portions C/n is set relative to the magnitude of the portion C/n of the capacitance, in such a way that the reflective coefficient of the millimetric way or microwave power in the desired frequency band is less than 0.2 and preferably less than 0.1.

In most applications, a suitable number of the portions C/n of the capacitance C is from 2 to 6. In many embodiments, the number can be selected from the range 3 to 5.

The invention claimed is:

1. A micromechanical sensor for measuring millimetric wave or microwave power, comprising:
a wave line for conducting the millimetric or microwave power;
a moving part;
an inductive load; and
a fixed electrode, configured to change the capacitance (C) between the moving part and the fixed electrode by moving the moving part based on a force of the millimetric or microwave power conducted in the wave line, wherein the capacitance (C) between the moving part and the fixed electrode is divided into n portions, wherein n is at least two, wherein each portion is located at a distance from each other, and wherein the n portions are arranged so that the wave line conducts the millimetric or microwave power to each of the n portions of the capacitance (C) consecutively and each of the n portions experiences a portion of the inductive load.

2. The sensor of claim 1, wherein each distance between the n portions of the capacitance (C) is less than the wavelength of the millimetric or microwave power conducted in the wave line.

3. The sensor of claim 2, wherein the distances between the n consecutive portions of the capacitance (C) are essentially equally large.

4. The sensor of claim 1, wherein the capacitances of the n portions are mutually essentially equally large.

5. The sensor of claim 1, wherein the forces which arise when the millimetric or microwave power is conducted to the n portions of the capacitance (C) move the moving part.

6. The sensor of claim 1, wherein the n portions of the capacitance (C) are electrically separate but are connected mechanically to each other.

7. The sensor of any of claim 1, wherein n is from 2 to 6.

8. The sensor of claim 1, wherein the wave line includes a ground line, which grounds the moving part.

9. The sensor of claim 1, wherein the wave line includes a ground line, which grounds the n portions of the capacitance (C).

10. The sensor of claim 1, wherein the magnitude of the inductive load between the n portions is set relative to the magnitude of the portion (C/n) of the capacitance, in such a way that the reflective coefficient of the millimetric wave or microwave power in the desired frequency band is less than 0.2 and preferably less than 0.1.

11. The sensor of claim 1, wherein the wavelength of the millimetric or microwave power conducted in the wave line is in the range of 0 to 40 GHz.

12. The sensor of claim 1, wherein the reflective coefficient of the signal is less than a threshold value.

13. The sensor of claim 12, wherein the threshold value is less than 0.2.

14. The sensor of claim 13, wherein the threshold value is less than 0.1.

15. The sensor of claim 1, wherein the millimetric or microwave power is a microwave signal.

16. The sensor of claim 1, wherein the millimetric or microwave power is a millimetric wave signal.

17. The sensor of claim 1, further comprising a spring.

18. The sensor of claim 17, wherein the spring is configured to support the moving part.

19. The sensor of claim 17, wherein the spring is not metalized.

20. The sensor of claim 1, wherein the sensor is configured to be used in a mobile telephone.

* * * * *